(12) United States Patent
Draxelmayr

(10) Patent No.: US 7,825,732 B2
(45) Date of Patent: Nov. 2, 2010

(54) COMPENSATION FOR AMPLIFIERS DRIVING A CAPACITIVE LOAD

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/923,517

(22) Filed: Oct. 24, 2007

(65) Prior Publication Data

US 2009/0108933 A1 Apr. 30, 2009

(51) Int. Cl.
*H03F 1/14* (2006.01)
(52) U.S. Cl. .................. 330/292; 330/267
(58) Field of Classification Search .......... 330/292, 330/262–276, 255; 327/333
See application file for complete search history.

(56) References Cited

U.S. PATENT DOCUMENTS

| | | | | |
|---|---|---|---|---|
| 4,881,045 A * | 11/1989 | Dillman | | 330/253 |
| 5,745,010 A * | 4/1998 | Miyamoto et al. | | 330/294 |
| 5,854,573 A * | 12/1998 | Chan | | 330/292 |
| 6,144,257 A * | 11/2000 | Bouras et al. | | 330/277 |
| 6,690,226 B2 * | 2/2004 | Takai | | 327/530 |
| 2005/0104618 A1 * | 5/2005 | Han | | 326/27 |
| 2006/0226921 A1 * | 10/2006 | Hsu | | 331/57 |

OTHER PUBLICATIONS

Desai, et al., "A Dual-Supply 0.2-to-4GHz PLL Clock Multiplier in a 65nm Dual-Oxide CMOS Process", 2007 IEEE International Solid-State Circuits Conference, pp. 308-309, 605, 462-463, and 615.
Lin, et al., "A 0.8-V 0.25-mW Current-Mirror OTA With 160-MHz GBQ in 0.18-μm CMOS", IEEE Transactions on Circuits and Systems-II: Express Briefs, vol. 54, No. 2, Feb. 2007, pp. 131-135.
Peng, et al., "Transconductance with Capacitances Feedback Compensation for Multistage Amplifiers", Solid-State Circuits Conference, 2004. ESSCIRC 2004. Proceeding of the 30th European Volume, Issue, Sep. 21-23, 2004, pp. 143-146.
Hernes, et al., "A 92.5mW 205MS/s 10b Pipeline IF ADC Implemented in 1.2V/3.3V 0.13μm CMOS", 2007 IEEE International Solid-State Circuits Conference, pp. 462-463, 615.

* cited by examiner

*Primary Examiner*—Robert Pascal
*Assistant Examiner*—Khiem D Nguyen
(74) *Attorney, Agent, or Firm*—SpryIP, LLC

(57) ABSTRACT

This disclosure relates to load compensating multi-stage amplifier structures at an output of one of the amplifier stages.

7 Claims, 7 Drawing Sheets

COMPENSATION FOR AMPLIFIERS DRIVING A CAPACITIVE LOAD

BACKGROUND

Many circuit blocks require analog input or reference signals for their operation. At the same time, they load these input and/or reference signals in a capacitive and/or resistive way. In many cases, capacitive loading is the more important of the two as it determines the dimensioning of the circuit. Typical examples include Switched Capacitor (SC) circuits. However, even Continuous Time (CT) circuits are often determined by the size of capacitors since quite frequently such establishes the noise limit of the circuit. These capacitive loads usually have to be driven by some amplifier or buffer circuit, which requires compensation to achieve satisfactory stability.

FIG. 1 shows a typical circuit configuration 100 for achieving compensation and including a single stage Operational Transconductance Amplifier (OTA) as a buffer. For a single-stage amplifier—that is, an amplifier having only one high-gain node located at the output—the compensation usually is done at the output node 102. This compensation is accomplished by a technique referred to as "load compensation." Load compensation utilizes a capacitor 104 connected to the output (i.e., high-gain node) 102. Such structures are known to have good power efficiency and as a rule of thumb they require a transconductance current about 1 µA/MHz/pF. In many cases, the amplification of a single-stage amplifier is insufficient or the output is driven by a special driver stage. In this case, the high-gain node(s) are located internally (i.e., not at the output) to the circuit, and the compensation is done internally as well. Such compensation is often referred to as "internal compensation."

FIG. 2 shows a typical example of an internal compensation circuit, commonly known as a Miller Amplifier 200. The Miller Amplifier 200 includes an output node 202. The Miller Amplifier 200 also includes a load capacitance 204 connected to the output node 202, and an internal compensation capacitor 206 connected to a high-gain node 208. The Miller Amplifier 200 design is less power efficient than the circuit 100 of FIG. 1 because the load-compensated OTA of circuit 100 has its transit frequency determined by $g_m/C_{load}$, wherein $g_m$ is the transconductance factor and $C_{load}$ is the capacitance of the load 104. Thus, some transistor current has to be sufficiently large to give the desired $g_m$.

For the Miller Amplifier 200 of FIG. 2, it is known that the output stage 210 should be approximately three times (3×) faster than the transit frequency, which leads to a $g_m$ that is three times (3×) higher than in the previous case (for the same transit frequency). Consequently, approximately three times (3×) the amount of current is needed. As can be seen, with the exception of single-stage OTAs (e.g., circuit 100 of FIG. 1), nearly all practical known circuits use internal compensation. Unfortunately, modern process technologies tend to have limited intrinsic gain factors. This leads to the need to move toward multiple stage amplifiers. Several schemes are known for compensation. However, these have several drawbacks, such as increased power consumption and complicated design. Therefore, research is ongoing. See Xianhong Peng and Willy Sansen; *Transconductance with Capacitances Feedback Compensation for Multistage Amplifiers*; Solid-State Circuits Conference, 2004, ESSCIRC 2004, Proceeding of the 30th European Volume, 21-23 Sep. 2004 Issue, pp. 143-146.

One circuit that utilizes load compensation is a Low-Dropout (LDO) voltage regulator. However, the relevant capacitor values for such LDO's are usually in the (multi) µF-range and are therefore placed outside the integrated circuit (IC) on a printed circuit board (PCB). This solution is not feasible for non-static conditions such as for voice and data communication. It is also not desirable due to cost of pins and external capacitors.

FIG. 3 shows a general four-stage cascaded amplifier 300. Multi-stage amplifiers having the general structure of exemplary cascaded amplifier 300 are more complex and less stable than single-stage amplifiers described in the prior art and, therefore are more difficult to frequency compensate. Moreover, when using multi-stage amplifiers, it is typically desired to generate meaningful amplification at each stage. For example, it may be desired in a given circuit to achieve 40 dB at each amplifier stage of a four-stage amplifier in order to result in 160 dB of gain overall.

FIG. 4 depicts a Bode plot 400 corresponding to the cascaded amplifier 300 of FIG. 3. Traditionally, amplifiers exhibiting 40-80 dB per stage were quite easy to create and the number of stages could be limited to one or a few stages. However, more recent process developments have made achieving 40 dB or higher in a single stage quite difficult. Moreover, if an amplifier stage is to have 40 dB of gain and the stage exhibits a corner frequency of 1 MHz and a unity gain bandwidth of 100 MHz, this leads to an unstable amplifier with a corner frequency (i.e., pole) of 1 MHz at each amplifier stage. Satisfactory stability requires an amplifier structure and compensation method that has only one dominant pole situated at the frequency below 100 MHz.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for load compensating amplifier/buffer circuit structures. According to one implementation, a circuit structure is provided that drives a relatively high capacitive load, which may be fully integrated, with at least one high-gain node distinct from the output node and internal to the circuit. This structure is generally characterized by the dominant pole appearing at the output. The high-gain node is characterized by a high direct-current (DC) impedance, such as that which results from the connection of transistor drains, which are often connected to a load resistor.

A current-degenerated diode may also be used as a load. For purposes herein, current mirror inputs are not considered as high gain nodes.

Also disclosed herein are techniques for the load compensation of fully-integrated amplifiers, i.e., amplifiers having no capacitors external to the integrated circuit other than the load, which have a high gain node that occurs internally in the circuit.

According to another implementation, a method is provided for load compensation of an amplifier/buffer.

In accordance other aspects, circuits are provided that include internal high-gain nodes and compensation by way of a capacitive load.

The techniques described herein may be implemented in a number of ways. One example environment and context is provided below with reference to the included figures and ongoing discussion.

Exemplary Systems

Figure 5:
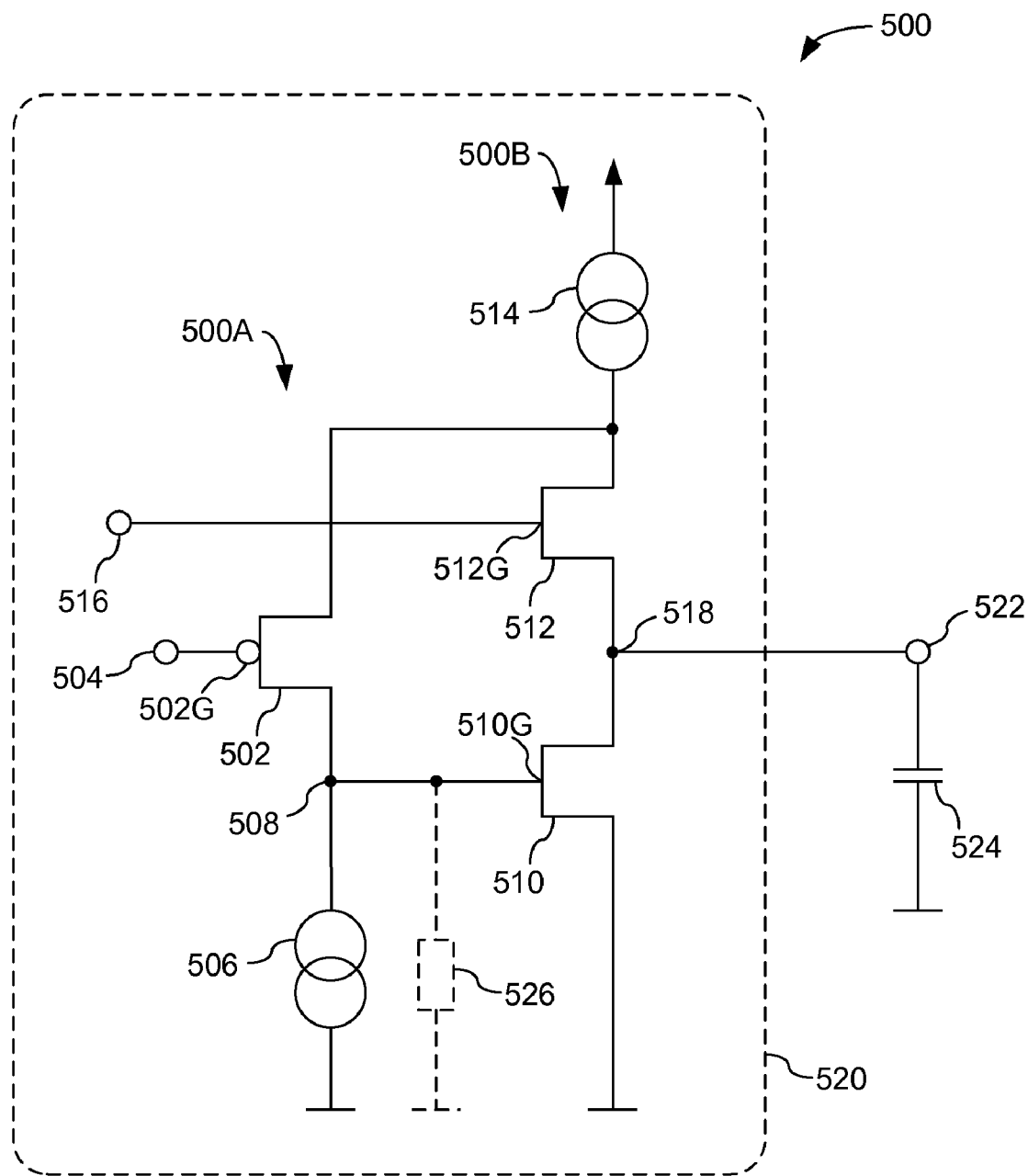
FIG. 5 is a circuit diagram of a buffer in accordance with the present teachings.

FIG. 5 depicts a circuit diagram of a circuit 500, such as a level-shifting buffer, that utilizes and incorporates load compensation, i.e., compensation at the output. The circuit 500 includes a transistor 502 having a gate 502G (i.e., control node) that is connected to a bias voltage input node 504. The transistor 502 is further connected in series circuit arrangement with a current source 506. A high-gain node 508 is defined at the connection of (i.e., between) the transistor 502 to the current source 506. The transistor 502 and current source 506 define a first circuit portion 500A of the circuit 500.

The circuit 500 of FIG. 5 also includes a transistor 510, a transistor 512 and a current source 514 coupled in series circuit arrangement. The transistor 510, the transistor 512 and the current source 514 define a second circuit portion 500B of the circuit 500. The gate 510 G (i.e., control node) of the transistor 510 is connected to the high-gain node 508.

The gate 512G (i.e., control node) of the transistor 512 is connected to a reference voltage input node 516. An output node 518 is defined at the connection of (i.e., between) the transistor 510 to the transistor 512. In some implementations, the respective components and nodes 502-518, inclusive, can be fully-integrated and as such considered internal to an integrated circuit 520.

The circuit 500 of FIG. 5 further includes an output 522 connected directly to the output node 518. A load capacitance (i.e., capacitor) 524 is connected to the output 522. As shown in the implementation of FIG. 5, the load capacitance 524 can be external to the integrated circuit 520, yet the load capacitance 524 is also directly electrically connected to the output node 518 of the circuit 500. The overall response of the circuit 500 corresponds to the Bode plot 700 described below.

To more fully appreciate the present teachings, the following Table 1 of comparative and contrasting features is provided:

TABLE 1

Figure 1:
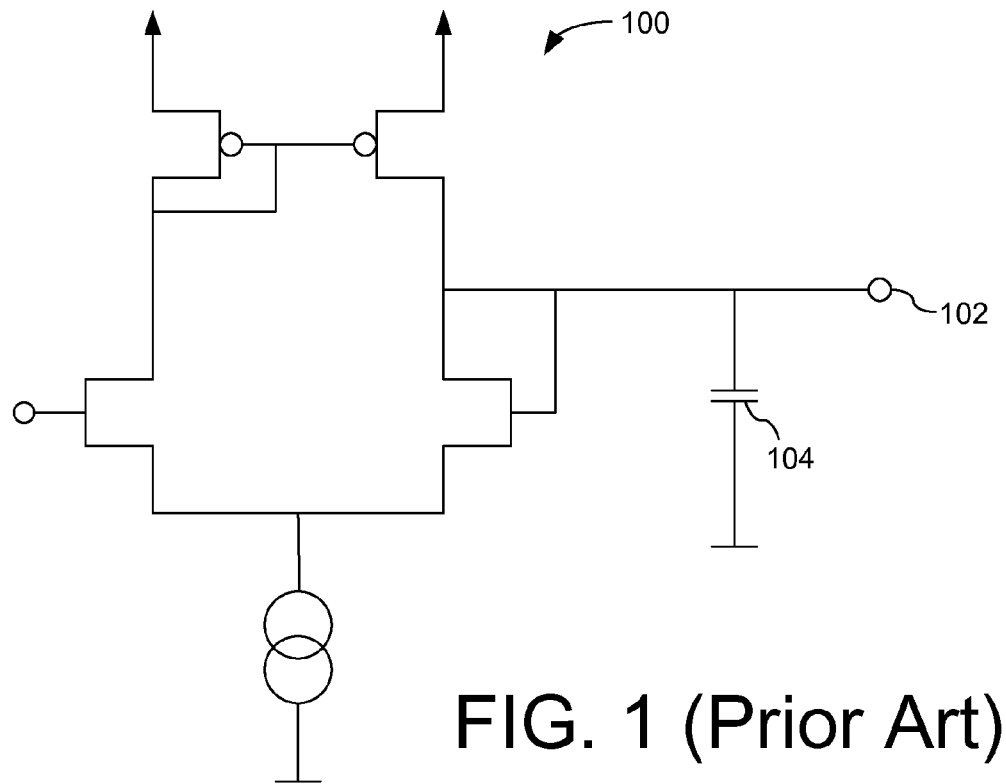
FIG. 1 is a circuit diagram of a single stage amplifier with load compensation.
Figure 2:
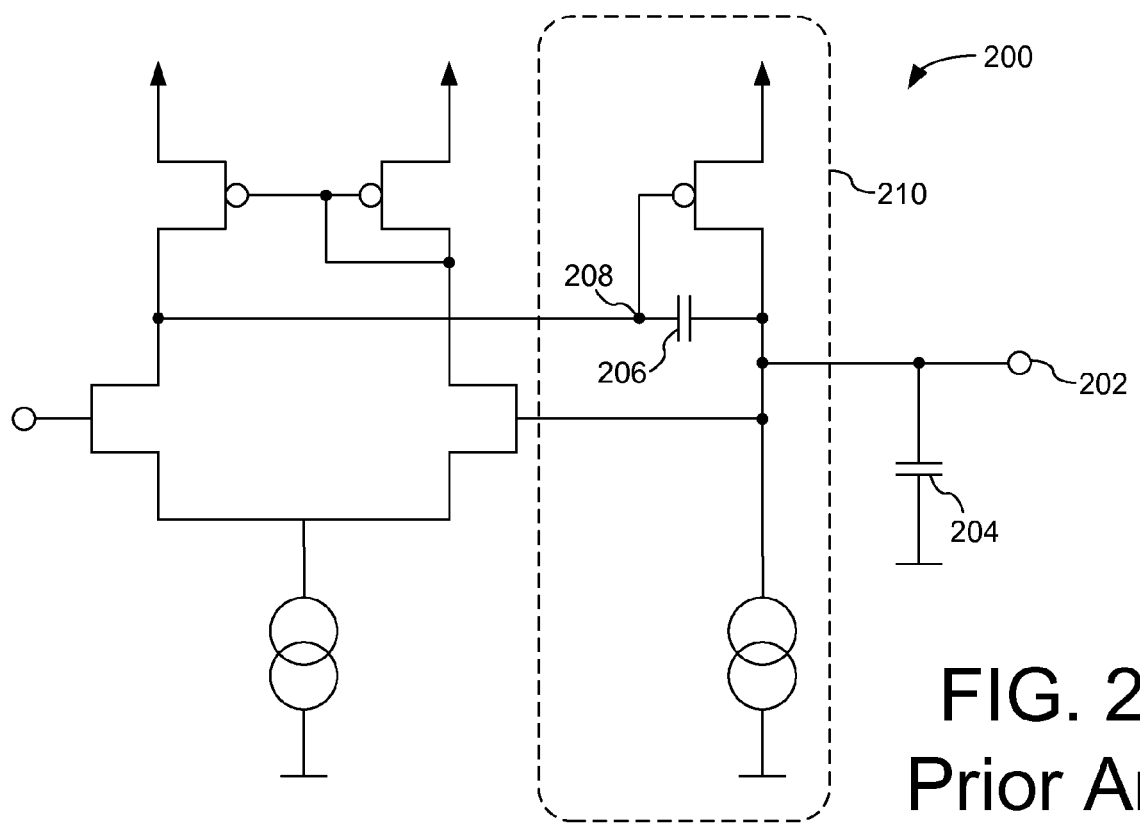
FIG. 2 is a circuit diagram of a single stage Miller Amplifier with internal compensation.
Figure 3:
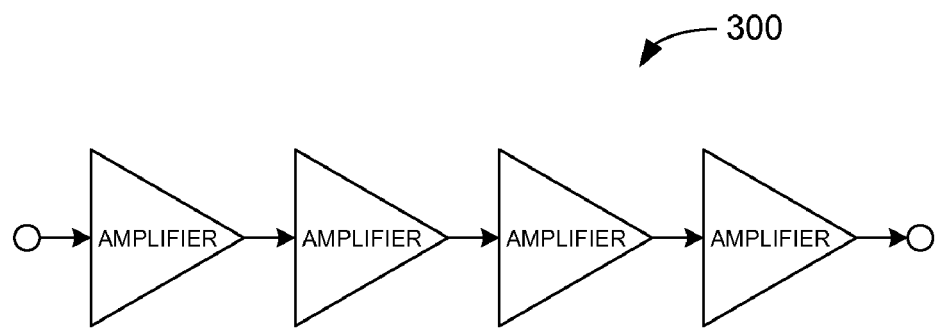
FIG. 3 is a symbolic diagram of an illustrative four-stage cascaded amplifier.
Figure 4:
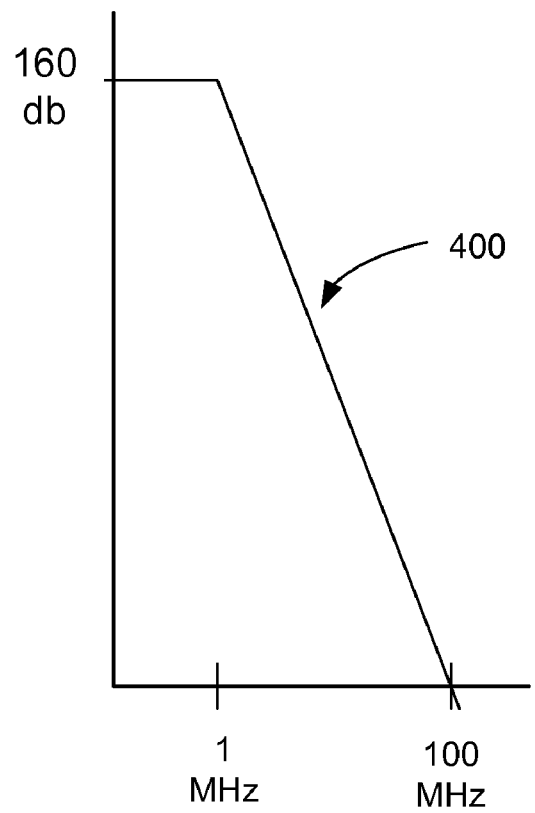
FIG. 4 is a Bode plot corresponding to the cascaded amplifier of FIG. 3.

| Circuit | High-Gain Node | Compensation |
| --- | --- | --- |
| 100 of FIG. 1 | Same as output | Load compensation |
| 200 of FIG. 2 | At least one high-gain node is distinct from output* | Internal compensation |
| 500 of FIG. 5 | Distinct from output | Load compensation |

*FIG. 2 has 2 high gain nodes: Output (202) and internal (208) which requires compensation (206)

With reference to Table 1 above and FIG. 5, it is noted that the high-gain node 508 and the output node 518 are distinct from one another within the circuit 500. It is further noted that there is no compensation capacitor directly connected to the (internal) high-gain node 508. However, this does not preclude the use of capacitance and/or capacitors as part of the circuit 500, is such use is for reasons other than compensation. Thus, the configuration and performance characteristics of the circuit 500 of FIG. 5 are distinct from those of both known circuits 100 and 200, respectively.

The response of the circuit 500 is characterized by a dominant pole, or corner frequency, that is readily determined by way of the load capacitor 524. In one implementation, the load capacitor 524 is a capacitance generated by a load. In another implementation, the load capacitor 524 is a compensation capacitor. As indicated hereinabove, the load capacitor 524 may external to the integrated circuit 520; however, the load capacitor 524 may also be integral with the integrated circuit 520. Nonetheless, the high-gain node 508 is achieved without a compensation capacitor coupled to the node 508. The corner frequency can be variably selected or "programmed," to at least some extent, by way of the particular value of the load capacitance 524.

According to the presently described techniques, parasitic capacitance on the high-gain node 508 is avoided. The maximum gain given by the high-gain node 508 may be limited by, for example, placing an optional resistor 526, current degenerated diode, or other suitable load in parallel with the node 508, in order to ensure a sufficiently high corner frequency.

In the event that the gain is insufficient, several low-gain stages are cascaded in series to provide multiple non-dominant poles. Compensation, as defined by the dominant pole is then accomplished by way of a load capacitor 524 connected at the output 522 of the circuit 500. The output of the structure typically operates in class AB mode, which has a low quiescent current but also has the ability to slew relatively large currents if necessary.

Implementations of the present teachings (e.g., circuit 500 of FIG. 5, etc.) provide for frequency compensation without the need for internal compensation, with operation of some implementations running well into the upper MHz or lower GHz frequency ranges. Furthermore, active component count in various implementations is reduced in comparison, for example, to the Miller Amplifier 200 of FIG. 2. Distinct high-gain and output nodes are defined by the structures of the present teachings. In one or more fully-integrated implementations, frequency compensation is accomplished by way of a load capacitor located externally to the integrated circuitry. Other implementations, which are partially- or non-integrated, respectively, can also be used. The circuits and structures of the present teachings lend themselves to fabrication, in part or in whole, within a 65 nanometer (or smaller) environment. Moreover, utilizing a load compensation circuit, such as circuit 500, yields desirable gain and frequency characteristics as can be observed using a bode plot.

Figure 6:
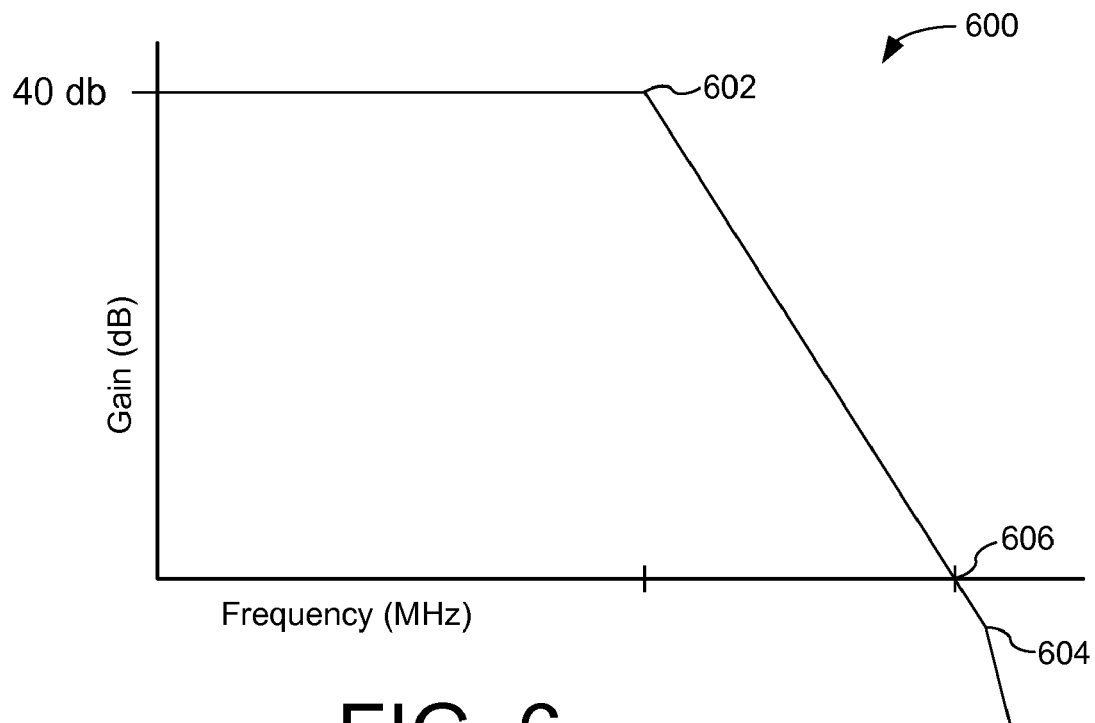
FIG. 6 is a Bode plot corresponding to the Miller Amplifier of FIG. 2.

FIG. 6 shows an exemplary Bode plot 600 for a typical internally compensated circuit (e.g., the Miller Amplifier 200). Within Bode plot 600, a dominant pole 602 is present and corresponds to the internal compensation of the representative circuit. With reference to the Miller Amplifier 200, such a dominant pole 602 is determined by the value of the internal compensation capacitor 206. The Bode plot 600 further includes a non-dominant pole 604 that is associated with the value of the capacitive load 204. The speed (i.e., response) of the non-dominant pole 604 is given by $g_m/C_{load}$. Thus, a sufficient amount of current must be provided through the output device to achieve a desired transit frequency 606 and to make the device operate at sufficient speed.

Figure 7:
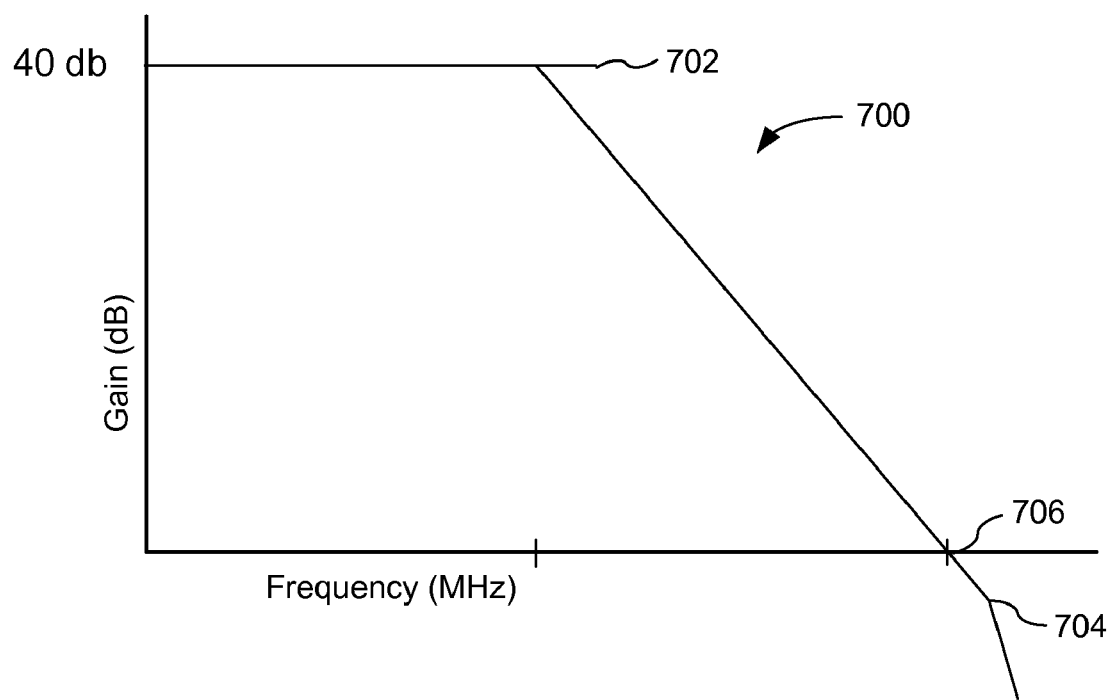
FIG. 7 is a Bode plot corresponding to the present teachings.

FIG. 7 shows an exemplary Bode plot 700 in which a single, dominant pole 702 (i.e., corner frequency) is present and corresponds to a capacitive load connected to the output node of an exemplary circuit, such as circuit 500. The output node is also the location of a low gain node associated with a device implementing the node. Also depicted in the Bode plot 700 is a non-dominant pole 704 corresponding to another node (other than the output node) located internally to the present circuit. The current through the output device of such a present circuit can be significantly reduced (i.e., lower frequency) from that required for the Miller Amplifier 200 and the fast pole might be achievable with even less current than that required for the Miller Amplifier 200, because only a much smaller internal (e.g., parasitic) capacitor has to be driven. In essence, the present structure can be stabilized at around the same transit frequency 706 as the transit frequency 606 but with significantly less current as compared, for example, with the Miller Amplifier 200.

To summarize, Bode plots 600 and 700 have a similar shape. However, the dominant pole 602 is generated by internal compensation, while the dominant pole 702 is generated by a load (e.g., capacitance) at the output. Thus, the Bode plot 700 corresponds to a simpler and less power-hungry design.

Circuit 500 accommodates the decreasing feature sizes of modern circuit designs, such as designs based on 65 nm processes. The process evolution toward smaller feature size leads to a reduction in supply voltage as well as higher intrinsic speeds. The lower supply voltage, in turn, leads to a lower signal swing. In order to keep a desired signal to noise ratio (SNR), capacitive loads must be increased as noise and capacitance is governed by the well-know "kT/C" law. The structure of circuit 500 includes a high speed first amplifier stage that does not require internal compensation, followed by a load compensated final stage. Thus, circuit 500 enhances speed in the initial amplifier stages and is compensated using a load coupled to the output of the final amplifier stage.

Figure 8:
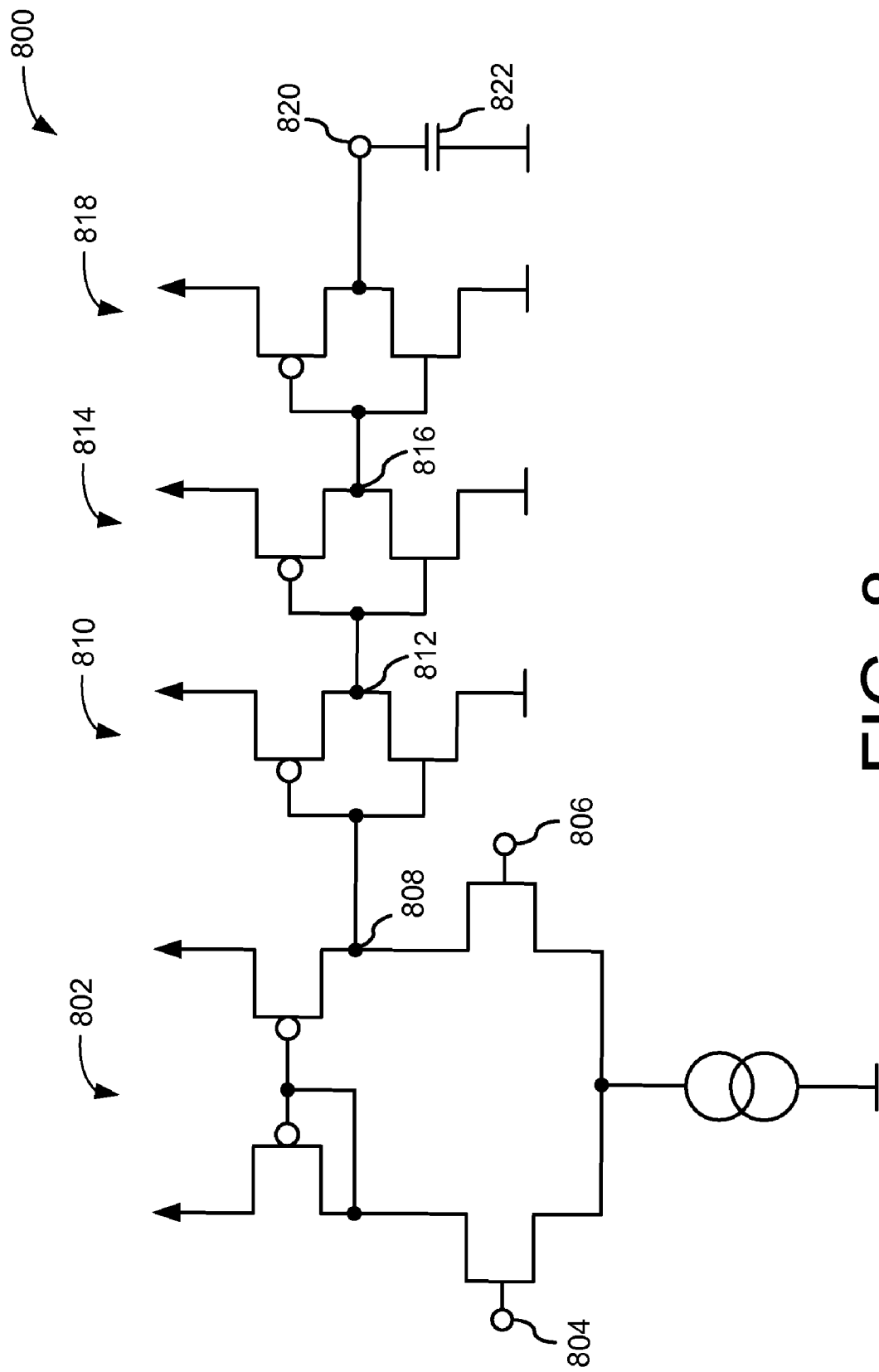
FIG. 8 is a circuit diagram of a multi-stage amplifier in accordance with the present teachings.

FIG. 8 is an alternative circuit diagram of a multi-stage amplifier (amplifier) 800 in accordance with the present teachings. The amplifier 800 includes a current mirror stage 802 including a first terminal 804 and a second terminal 806, which may accommodate input signals. An output 808 of the current mirror stage 802 is connected to a first amplification stage 810. An output 812 of the first amplification stage 810 is connected to a second amplification stage 814. In turn, an output 816 of the second amplification stage 814 is connected to a third (and final) amplification stage 818. The third amplification stage 818 includes an output 820 having a load capacitor 822 coupled thereto. In one implementation, the load capacitor 822 is a capacitance generated by a load. In another implementation, the load capacitor 822 is a compensation capacitor. The load capacitor 822 may external to an integrated circuit; however, the load capacitor 822 may also be integral with an integrated circuit. Nonetheless, a high-gain node is achieved without a compensation capacitor coupled to a node associated with the high-gain node.

Figure 9:
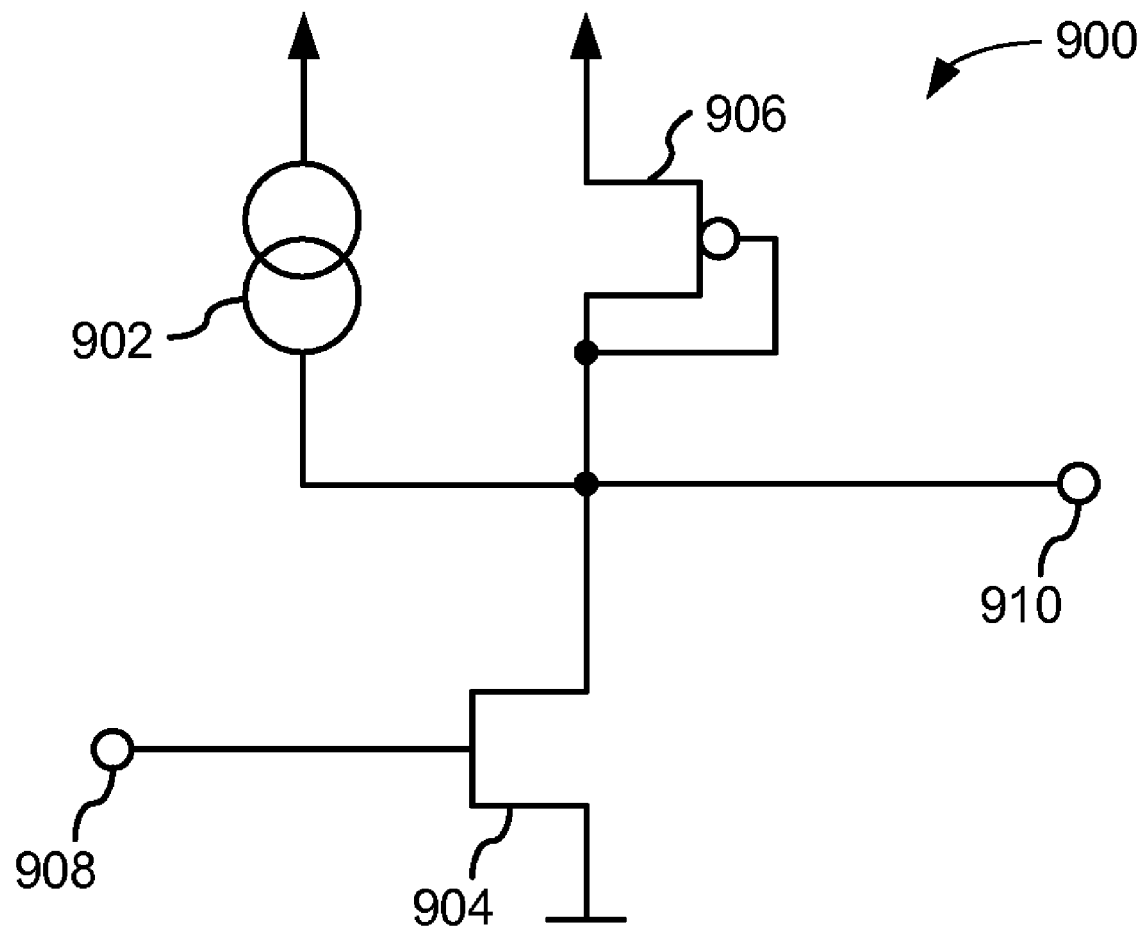
FIG. 9 is a circuit diagram of an illustrative current-degenerated load.

FIG. 9 is a circuit diagram of an illustrative amplifier 900 with current-degenerated load (load). The load includes a current source 902, and a transistor 906. A control node (i.e., gate) of the transistor 904 is connected to an input 908 of the amplifier 900. Also, the amplifier 900 includes an output 910.

The amplifier 900 may be configured to entirely replace one or more of the stages, e.g. amplifier stages 802, 810, and so forth. Additionally or alternatively, the current degenerated load, having the current source 902 and the transistor 906, may be utilized as a part of one or more of the amplifier stages 802, 810, and so forth. For example, the load may replace resistor 526. According to this example, the current source 902 may be omitted and current may instead be provided by current source 506. According to another example, the load may also be connected in parallel to the NMOS and PMOS transistors of the inverter amplifier stages, e.g. amplifier stages 810, 814, 818. In such a case, the loads are sized such that their $g_m$ is significantly smaller than the $g_m$ of the driving transistors, in order to provide the desired gain.

Figure 10:
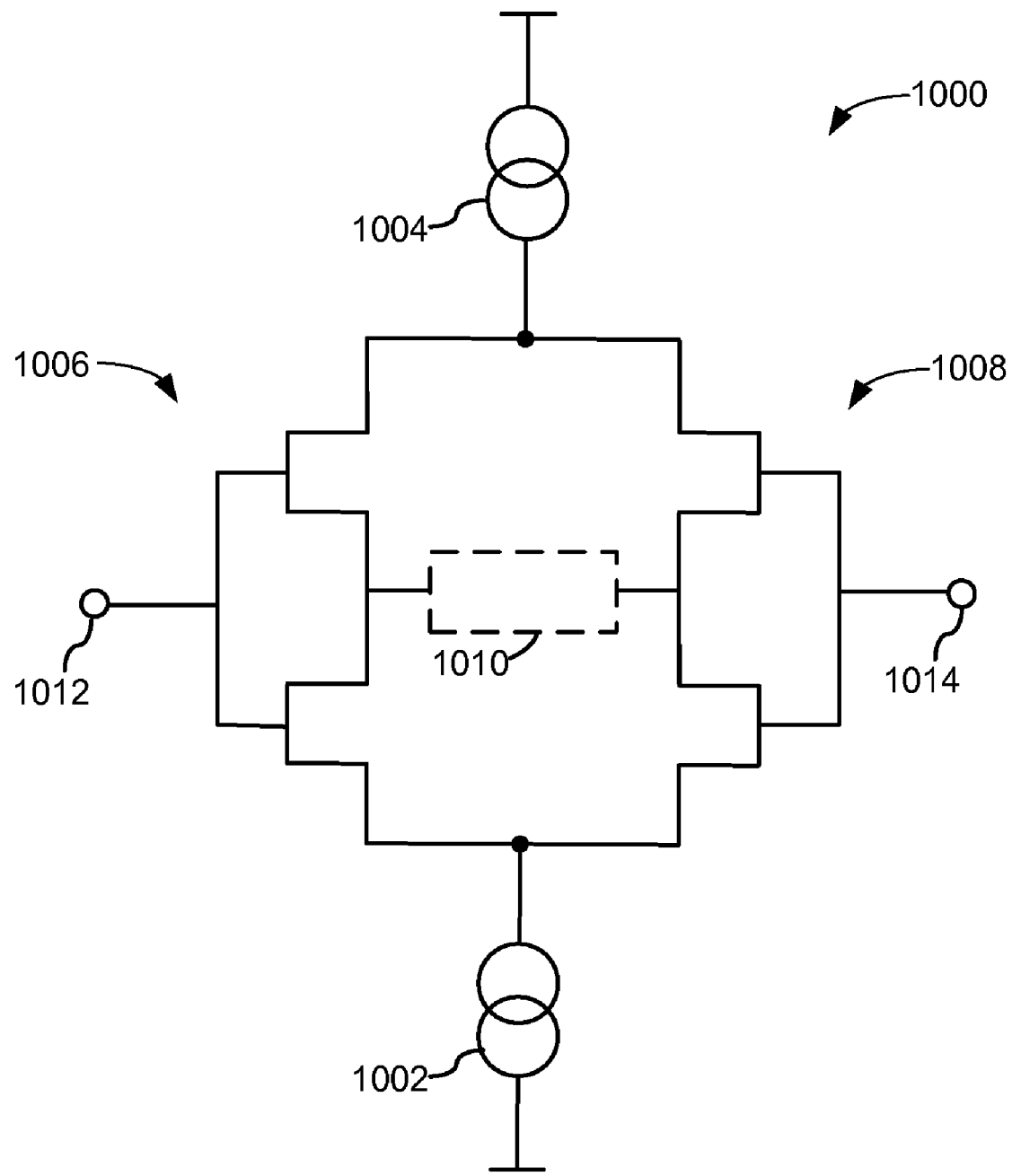
FIG. 10 is a circuit diagram of an illustrative amplifier stage.

FIG. 10 is a circuit diagram of an illustrative differential amplifier stage 1000. For example, the amplifier stage 1000 may replace the current mirror stage 802 in the amplifier 800 and/or other amplifier stages, e.g. amplifier stages 802, 810, and 814. The fully differential amplifier 1000 could replace all the amplifier stages in FIG. 800 (i.e., 802, 810, 814, 818) to provide a fully differential 4-stage amplifier. Amplifier stage 1000 includes current sources 1002 and 1004, a first inverter 1006, and a second inverter 1008. A resistor 1010 or other load may be connected between the inverters. The amplifier stage 1000 also includes terminals 1012 and 1014, which may accommodate input signals.

The capacitive load has generally been described above as a capacitor. However the capacitive load could also be an electronically amplified version of a capacitor, for example a capacitor whose value is boosted in using the miller effect. This would lead to a multi-stage structure as discussed (having internal high gain node(s), compensation only being at the end of this cascade. This could be achieved, e.g. by placing capacitor 822 between nodes 816 and 820. One could use node 816 as an output (giving a 3-stage amplifier with electronically enhanced load capacitor generating the dominant pole) or node 820 (which would give a 4-stage amplifier with miller compensation but without having the need to do nested miller compensation or any of the other more or less complicated methods that can be found in literature).

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. An electronic circuit, comprising:
   a first transistor and a first current source connected in series circuit arrangement, wherein a high-gain node is defined between the first transistor and the first current source and a resistor is coupled in parallel with the high-gain node; and
   a second transistor, a third transistor, and a second current source connected in series circuit arrangement, wherein an output node is defined between the second transistor and the third transistor, and wherein a control node of the second transistor is coupled to the high-gain node
   wherein: the electronic circuit is a fully-integrated circuit; and the electronic circuit is configured such that the load capacitance is located external to the fully-integrated circuit.

2. The electronic circuit of claim 1, wherein: a response of the electronic circuit is characterized by a dominant pole; and a location of the dominant pole is determined by a load capacitance connected to the output node.

3. The electronic circuit of claim 1, wherein a control node of the first transistor is coupled to a bias voltage.

4. The electronic circuit of claim 1, wherein a control node of the third transistor is coupled to a reference voltage.

5. The electronic circuit of claim 1, wherein the electronic circuit defines a level shifting buffer.

6. The electronic circuit of claim 1, wherein no capacitor is connected to the high-gain node.

7. The electronic circuit of claim 1, wherein: the first transistor and the second transistor and the third transistor are field-effect transistors; and the control node of the second transistor is a gate of a field effect transistor.

* * * * *